Nov. 8, 1960 G. D. M. SWEENY 2,959,498
CONDUCTIVE CIRCUIT BONDED TO A RESINOUS DIELECTRIC
AND METHOD FOR PRODUCING SAME
Filed Oct. 2, 1957
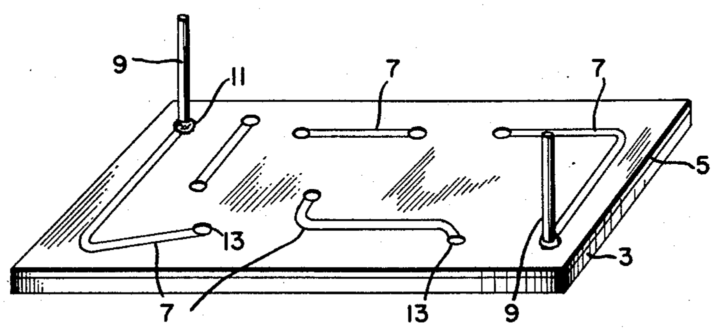
INVENTOR
GILBERT D. M. SWEENY
BY Louis A. Wirtz
ATTORNEY United States Patent Office 2,959,498
Patented Nov. 8, 1960

2,959,498

CONDUCTIVE CIRCUIT BONDED TO A RESINOUS DIELECTRIC AND METHOD FOR PRODUCING SAME

Gilbert D. M. Sweeny, Louisville, Ky., assignor to E. I. du Pont de Nemours and Company, Wilmington, Del., a corporation of Delaware Filed Oct. 2, 1957, Ser. No. 687,745

2 Claims. (Cl. 117—212)

This invention relates to a resinous dielectric panel containing bonded thereto a conductive silver circuit. It also relates to a method of forming such a bonded silver circuit on a resinous dielectric.

An electrically conductive circuit pattern adhered to a dielectric base must be sufficiently conductive to adequately carry the necessary electric current, it must be readily solderable so that electrical components may be readily attached by soldering to the circuit, and the circuit pattern must be firmly adhered to the resinous dielectric base. Conductive patterns on dielectric panels, prepared by adhering finely divided metal (usually silver) to such panels, have heretofore only been adequately adhered when the finely divided silver is mixed with a vitreous enamel frit and the mixture applied and fired on a ceramic (glass, porcelain, china, etc.) base. Since resinous panels cannot be highly heated, the adherence of the finely divided metal patterns (often referred to as "printed silver circuits") on such resinous surface must depend upon the use of organic binders or adhesives. Such materials include, for example, thermosetting and thermoplastic resins which may be cured or set at a temperature under about 250° C. Such compositions and formulations of finely divided silver in thermosetting or thermoplastic resins were unsatisfactory for the preparation of printed silver circuits on resinous dielectric surfaces. Not only did these compositions fail to adhere properly but where the proportion of adhesive was slightly in excess of the amount just necessary to hold the silver particles together, the conductivity of the circuit was too low and silver layers did not accept solder satisfactorily.

As a result, when electrically conductive circuit paths have been formed on resinous dielectric surfaces they have most frequently been formed laboriously by cladding the entire surface of the dielectric with copper and dissolving off all of the clad copper except the desired lines or paths of the circuit. A few circuits have been formed by copper plating the conductor design on the dielectric or by die stamping metal foil or powder in a desired pattern on a dielectric base. Such practice is either very expensive or is unsatisfactory because of poor adherence or conductivity.

It is an object of this invention to provide an improved conductive circuit bonded to a resinous dielectric.

It is also an object of this invention to provide an improved process for satisfactorily adhering a conductive silver pattern on a resinous dielectric.

Other objects of this invention will appear hereinafter.

These objects may be accomplished by first applying to a resinous dielectric surface a layer of an incompletely cured thermosetting resin, and then applying on said layer, in the outline of the desired conductive circuit, a layer of finely divided silver admixed with a thermoplastic resin containing a solvent for both of said resins, and then heating to cure both layers of applied resins.

Even though the resinous dielectric panel may be composed of a thermosetting resin, it is essential in accordance with this invention that the resinous panel first be coated with a thermosetting resin. Although such undercoating need only be applied to such portions of the dielectric panel as will later underlie the printed silver circuit pattern, it is usually most expedient to coat the entire surface of such panel with the undercoat.

Many thermosetting resins are known in the art, for example, phenol-formaldehyde resins, some of the urea-formaldehyde and alkyd resins, rubber resins, chlorinated rubber resins, epoxy resins, and polyurethane resins. Any of such thermosetting resins may be applied from their solvent solutions as the undercoat. Particularly outstanding results have been obtained by the use of butadiene-acrylonitrile copolymer resins as such undercoating. The thermosetting resins are preferably heated for a short time at a moderate temperature to partially cure the same. These undercoats should not be completely cured at this stage. For example, heating the same for a period of two to fifteen minutes at a temperature of 100° to 140° C. will dry the coating sufficiently to permit handling and yet incompletely cure the same to permit at least partial solution by the solvent of a subsequently applied thermoplastic resin, solvent, silver composition.

The conductive circuit is applied over the undercoating by spraying, brushing, painting, or preferably squeegeeing a silver paste comprising a thermoplastic resin and a solvent for both the thermoplastic and thermosetting resins in the desired electric circuit pattern. The silver paste is composed of finely divided silver particles (10 mesh or smaller) in a thermoplastic resin, for example, normal or isobutyl methacrylate, polyvinyl acetate, polyvinyl chloride, or the like, in a ratio of between 4 to 1 and 10 to 1 silver to resin. The resin is kept in soft paste or creamy consistency by a solvent for the resin and, if desired, a resin plasticizer such as dibutyl phthalate, tricresyl phosphate, or the like. The solvent may be methyl ethyl ketone, acetone, terpineol, xylene, methyl acetate, methyl, ethyl or butyl Cellosolve acetate, ethyl acetate, toluene, benzene, chlorobenzene, butanol, ethanol, or any similar solvent that will have a solvent action, at least a softening action, on both undercoating resin and thermoplastic resin. After application of the conductive silver circuit, preferably by squeegeeing through a screen stencil, upon the thermosetting undercoating, the panel is subjected to a heating at a sufficiently high temperature and for a sufficient period of time to cure the thermosetting undercoating as well as to dry out the thermoplastic silver circuit.

The resulting silver circuit pattern will be firmly adhered to the resinous panel and the silver lines will readily accept solder.

The accompanying drawing is a diagrammatic illustration showing the principles of this invention.

In the drawing, reference numeral 3 designates a resinous base panel on which is applied an undercoating 5 of a thermosetting resin, preferably a resin containing a predominance of a butadiene-acrylonitrile copolymer. A plurality of electrically conductive paths 7 composed of finely divided silver in a thermoplastic resin, preferably butyl methacrylate, are positioned on the panel to constitute an electrical circuit. The paths 7 may be connected to terminals 9 by solder 11, or to other components or paths through holes 13.

The following examples are given to illustrate certain preferred embodiments of my invention.

*Example I*

A dielectric panel composed of XXXP-phenol-formaldehyde laminate base material (a typical laminated dielectric board comprising a plurality of layers of fabric impregnated with phenol formaldehyde resin), conventionally used for radio or television circuits, is first thoroughly cleaned by washing with acetone. The dry panel is then coated by spraying with a thermosetting resin composition consisting of a ternary copolymer of butadiene, acrylonitrile and methacrylic acid mixed with a phenol-formaldehyde resin and methyl ethyl ketone solvent. This resin composition is sprayed on at a rate of 0.15 to 0.35 gram per square inch of base area. The coated base panel is then dried for ten minutes at a temperature of about 120° C. The dried panel is then provided with a printed silver circuit by squeegeeing a silver paste of the following composition through a silk screen stencil having the desired design of electrical circuit. The silver paste is prepared by mixing six parts by weight of 40-mesh silver particles with one part by weight of polymerized isobutyl methacrylate having a molecular weight of about 25,000 and sufficient butyl Cellosolve acetate to produce a soft paste. The panel is now placed in an oven and dried at a temperature of about 160° C. for twenty minutes.

The resulting printed silver circuit is readily solderable by conventional solder dipping or floating in a solder bath. A lead wire soldered to the printed silver has an average adherence in excess of 320 pounds per square inch.

*Example II*

A dielectric panel similar to that disclosed in Example I is cleaned and over-coated with a coating about 1/32 inch thick of the following thermosetting resin:

| | Percent by weight |
|---|---|
| Copolymer of butadiene and acrylonitrile | 17.7 |
| Tertiary butyl phenol-formaldehyde resin | 5.3 |
| Methyl ethyl ketone | 70.0 |
| Tertiary polymer of: Vinyl chloride 80.0–90; Vinyl acetate 19.7–7; Maleic acid 0.3–3 | 7.0 |

The coated panel is then dried for eight minutes at a temperature of about 110° C. The dried panel is then provided with a printed silver circuit by squeegeeing a silver paste of the composition of Example I in the desired design. The panel is next dried and cured at a temperature of 160° C. for twenty minutes.

The resulting printed silver circuit has about the same properties as the silver circuit described in Example I.

*Example III*

Example I was repeated using an undercoat comprising a copolyester resin as follows:

| | Percent by weight |
|---|---|
| A copolyester of: (1) Ethylene glycol (in molar excess) and (2) A mixture of the following acids in proportions shown: (a) terephthalic acid 40; (b) isophthalic acid 40; (c) adipic acid 10; (d) sebacic acid 10 | 20 |
| Methyl ethyl ketone | 60 |
| Dioxane | 20 |

The resulting printed circuit on the resinous panel had excellent soldering properties and a satisfactory adherence for commercial purposes.

The printed circuit panels of this invention not only have a greatly improved adherence over previously known resinous panels containing circuits applied without the employment of a thermosetting resin undercoat but they have a long shelf life and lack of sensitivity to processing conditions.

Throughout the specification and claims, any reference to parts, proportions and percentages refers to parts, proportions and percentages by weight, unless otherwise specified.

Since it is obvious that many changes and modifications can be made in the above-described details without departing from the nature and spirit of the invention, it is to be understood that the invention is not to be limited to said details except as set forth in the appended claims.

I claim:

1. A pre-set dimensionally rigid dielectric panel having a thermosetting polymeric butadiene-acrylonitrile resin coating and an electrically conductive silver-containing thermoplastic resin coating in the form of a desired electric circuit superimposed on said butadiene-acrylonitrile resin coating.

2. The method of forming a conductive silver circuit on a dielectric panel which comprises coating said panel with a butadiene-acrylonitrile resin coating, drying said resin without completely curing the same, applying a silver-containing electrically conductive thermoplastic resin coating in the form of a desired electric circuit over said butadiene-acrylonitrile resin coating, said silver-containing thermoplastic resin coating containing a solvent for both said butadiene-acrylonitrile resin and said thermoplastic resin, heating said panel to completely cure said resins and floating said panel, with the conductive surface in contact, in a solder bath whereby to coat said circuit with solder.

References Cited in the file of this patent

UNITED STATES PATENTS 2,721,152 Hopf et al. ............ Oct. 18, 1955

OTHER REFERENCES

"Printed Circuits Technique," N.B.S. Circular 468, U.S. Dept. of Commerce, Nov. 15, 1947. (Copy in 117–P.C.)

"New Advances in Printed Circuits," N.B.S. Miscellaneous Publication 192, U.S. Dept. of Commerce, Nov. 22, 1948. (Copy in 117–P.C.)